(12) United States Patent
Madok et al.

(10) Patent No.: US 7,313,456 B2
(45) Date of Patent: Dec. 25, 2007

(54) METHOD AND APPARATUS FOR CAPTURING AND USING DESIGN INTENT IN AN INTEGRATED CIRCUIT FABRICATION PROCESS

(75) Inventors: John H. Madok, San Jose, CA (US); Dennis J. Yost, Los Gatos, CA (US); Robin W. Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 486 days.

(21) Appl. No.: 10/818,929

(22) Filed: Apr. 5, 2004

(65) Prior Publication Data

US 2004/0201041 A1    Oct. 14, 2004

Related U.S. Application Data

(60) Provisional application No. 60/462,393, filed on Apr. 11, 2003.

(51) Int. Cl.
*G06F 19/00* (2006.01)
(52) U.S. Cl. .......................... 700/121; 700/117; 716/19
(58) Field of Classification Search ................. 700/97, 700/117, 121; 707/10; 716/1–21
See application file for complete search history.

(56) References Cited

U.S. PATENT DOCUMENTS

| | | | |
|---|---|---|---|
| 5,519,628 A * | 5/1996 | Russell et al. ................ 716/10 |
| 6,009,251 A | 12/1999 | Ho et al. | |
| 6,370,679 B1 | 4/2002 | Chang et al. | |
| 6,453,452 B1 | 9/2002 | Chang et al. | |
| 6,470,489 B1 | 10/2002 | Chang et al. | |
| 6,505,327 B2 | 1/2003 | Lin | |
| 6,523,162 B1 | 2/2003 | Agrawal et al. | |
| 6,523,165 B2 | 2/2003 | Liu et al. | |
| 6,526,547 B2 | 2/2003 | Breiner et al. | |
| 6,529,621 B1 | 3/2003 | Glasser et al. | |
| 7,003,749 B2 * | 2/2006 | Subasic et al. ................ 716/10 |
| 2002/0083401 A1 | 6/2002 | Breiner et al. | |

(Continued)

FOREIGN PATENT DOCUMENTS

WO    WO 00/36525 A    6/2000

OTHER PUBLICATIONS

Depesa, et al., "Automated Critical Dimension and Registration Communication," SPIE vol. 1604 11th Annual BACUS Symposium on Photomask Technology, Sep. 1991, pp. 26-33.

(Continued)

*Primary Examiner*—Leo Picard
*Assistant Examiner*—Sheela Rao
(74) *Attorney, Agent, or Firm*—Patterson & Sheridan LLP

(57) ABSTRACT

A method and apparatus for capturing and using design intent within an IC fabrication process. The design intent information is produced along with the design release by a design company. The design release and design intent information are coupled to an IC manufacturing facility where the design release is used for producing the layout of the integrated circuit and the design intent information is coupled to the equipment, especially the metrology equipment, within the IC manufacturing facility. As such, the design intent information can be used to optimize processing during IC fabrication to achieve optimization of the critical characteristics intended by the designer.

43 Claims, 6 Drawing Sheets

U.S. PATENT DOCUMENTS

2004/0098391 A1* 5/2004 Robertson et al. ............ 707/10
2004/0107412 A1* 6/2004 Pack et al. .................... 716/19
2004/0117746 A1* 6/2004 Narain et al. .................. 716/4

OTHER PUBLICATIONS

Kahng, "IC Layout and Manufacturability: Critical Links and Design Flow Implications," 12th International Conference on VSLI Design, 1999, pp. 100-105.

Ning, et al., "A Comparative Analysis of Run-to-Run Control Algorithms in the Semiconductor Manufacturing Industry," 1996 IEEE/SEMI Advanced Semiconductor Manufacturing Conference, Nov. 12, 1996, pp. 375-381.

European Search Report for 04008541.7, dated Apr. 25, 2004 (8410 EP).

Search report from Austrian Patent Office for Application No. 200401983-2 dated Jan. 20, 2006.

* cited by examiner

METHOD AND APPARATUS FOR CAPTURING AND USING DESIGN INTENT IN AN INTEGRATED CIRCUIT FABRICATION PROCESS

CROSS-REFERENCE TO RELATED APPLICATIONS

This application claims benefit of U.S. provisional patent application Ser. No. 60/462,393, filed Apr. 11, 2003, which is herein incorporated by reference.

BACKGROUND OF THE INVENTION

1. Field of the Invention

The present invention relates to integrated circuit (IC) fabrication processes and techniques. More particularly, the present invention relates to a method and apparatus for capturing and using design intent in an IC fabrication process.

2. Description of the Related Art

Modern integrated circuit (IC) design and fabrication processes are complex and require the input of many entities. Generally design companies prepare integrated circuit designs that are then released to an IC manufacturing facility that uses integrated circuit fabrication equipment in a manner defined by the design release to fabricate the integrated circuit. In many instances the design release, although it captures the specific layout of the integrated circuit, does not capture the design intent of the designer. This is because design intent may encompass a variety of parameters beyond merely the physical layout of circuit elements; for example, design intent can include guidelines drawn to criteria such as circuit yield, speed and power consumption, timing closure, among others. Thus, even if the physical layout of circuit elements appears to translate correctly from design to fabrication, this does not necessarily confirm that the fabricated IC embodies all parameters of the designer's intent. As such, critical aspects of the integrated circuit that were considered by the designer are not tested nor considered as critical by the IC manufacturing facility during IC fabrication. Consequently, the IC may not operate as intended by the designers.

FIG. 1 depicts a block diagram of an IC fabrication process. The process 100 is divided into a circuit design phase 102 and a circuit fabrication phase 104. Equipment 106 is provided to the circuit fabrication phase 104 to facilitate fabrication of the IC. In the circuit design phase 102, the design company 108 utilizes electronic design automation (EDA) tools 110 and component macro modules 112 to design the integrated circuit. The EDA tools rely on technical files 114 and the component macro modules 112 rely on technical files 116. The component macro modules 112 comprise a plurality of macros, where each macro defines a particular type of integrated circuit such as static random access memory, memory management unit (MMU), and other standard logic circuitry. The technical files 114 or 116 that are used to support the design are augmented with circuit and transistor models and model parameters that are supplied by the IC manufacturing facility 122. The models are developed and tested using transformations that ensure that the physical device will theoretically have the desired electrical characteristics. These models are generated using physics derivations and empirical analysis to correlate a measurable, physical feature to a design or performance requirement. One such model type for modeling transistors is a SPICE model. Other models may be used for modeling photolithography, interconnect structures and the like. The facility 122 supplies this information such that macros are developed to be optimized for a particular facility's equipment. As such, the component macros are developed and supplied to the design companies without charge. The macro developers are not paid directly for their component macros, but are paid on a royalty basis as each integrated circuit that uses the macro is produced by the IC manufacturing facility. Alternatively, access fees are charged for the component macros.

The ultimate design release is a layout that utilizes a plurality of component macros and other logic that interconnect the components to form an integrated circuit. The design release is sent to the IC manufacturing facility 122 along path 120.

The IC manufacturing facility 122 comprises EDA tools 124 that use the design release to produce masks for fabricating the integrated circuit and a wafer fabrication center 126 that uses the masks and the equipment supplied by the equipment manufacturer 130 along path 128 to fabricate the integrated circuit. Alternatively, the EDA tools 124 may be used in a separate facility from the IC manufacturing facility. The equipment manufacturer 130 supplies fabrication tools 132, methods 134 of using the tools 132, and various metrology equipment 136 that are used together for fabricating and testing wafers and circuits. The test results can be used to optimize the integrated circuit fabrication process performed by the tools 132.

The IC manufacturing facility 122 uses the equipment supplied on path 128 to fabricate masks and ultimately to fabricate the integrated circuit.

As mentioned above, various transistor models and parasitic capacitance models and model parameters are supplied from the IC manufacturing facility 122 to the circuit design phase 102 as components of the technical files 114, 116. Such feedback of the models and model parameters enables the design company to produce transistor designs that can be fabricated by the IC manufacturing facility 122.

The integrated circuits produced by the IC manufacturing facility should meet the design specifications that the design company was striving to achieve in the design release. However, the IC design assumes the IC dimensions are absolute and invariant, while the physical characteristics of an integrated circuit are generally statistical in nature such that the design company never achieves the exact physical characteristics that had been designed. The statistical nature of the physical characteristics (e.g., the layout) will result in a statistical variation in the electrical characteristics of the integrated circuit. Furthermore, the design company may have had critical characteristics (e.g., critical regions or critical pathways) around which the integrated circuit was designed and the manufacturing facility does not know of, nor consider, these critical characteristics when fabricating the IC. Consequently, the IC manufacturing facility ultimately produces an integrated circuit that is not optimized for these critical characteristics.

Therefore, there is a need in the art to capture and use the design intent of a designer such that the integrated circuit produced by a foundry is optimized using the design intent.

SUMMARY OF THE INVENTION

The invention provides a method and apparatus for capturing and using design intent within an IC fabrication process. The design intent information is produced along with the design release by a design company. The design release and design intent information are coupled to an IC manufacturing facility where the design release is used for producing the layout of the integrated circuit and the design intent information is coupled to the equipment, especially the metrology equipment, within the IC manufacturing facility. As such, the design intent information can be used to optimize processing during IC fabrication to achieve optimization of the critical characteristics intended by the designer. Parameters specified by the circuit designer, such as circuit yield, speed, power consumption, and the like, are thus substantially achieved in the fabricated circuit.

In one embodiment of the invention, the design intent information comprises the identification of specific critical components within the integrated circuit that should be focused upon by the metrology equipment to ensure that certain critical characteristics are achieved during fabrication. In another embodiment of the invention, the design intent of achieving optimization of the longest speed path within an integrated circuit is coupled to the equipment such that the metrology equipment can monitor critically important locations and critical dimensions of the longest speed path to ensure that the integrated circuit will operate as characterized by the design company. In another embodiment, certain design rules may be developed by the equipment manufacturer to optimize certain types of circuits within the equipment. These design rules are coupled to the design company, which embeds these design rules into the component macro modules or other component models to ensure that certain structures that are developed by the macro consider the design rule requirements of the equipment's manufacturing capability. The models and macros will contain manufacturability information that is related to the equipment that is to be used to produce the IC. As such, when these macro modules are used to design components within the integrated circuit the equipment within the IC manufacturing facility will automatically consider the design rule parameters and optimize that circuit manufacturing process or layout. Payment for the design rule may occur at the same time that the component macro module designers are paid (i.e., at the time that a royalty is paid for the integrated circuit being produced by the foundry).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
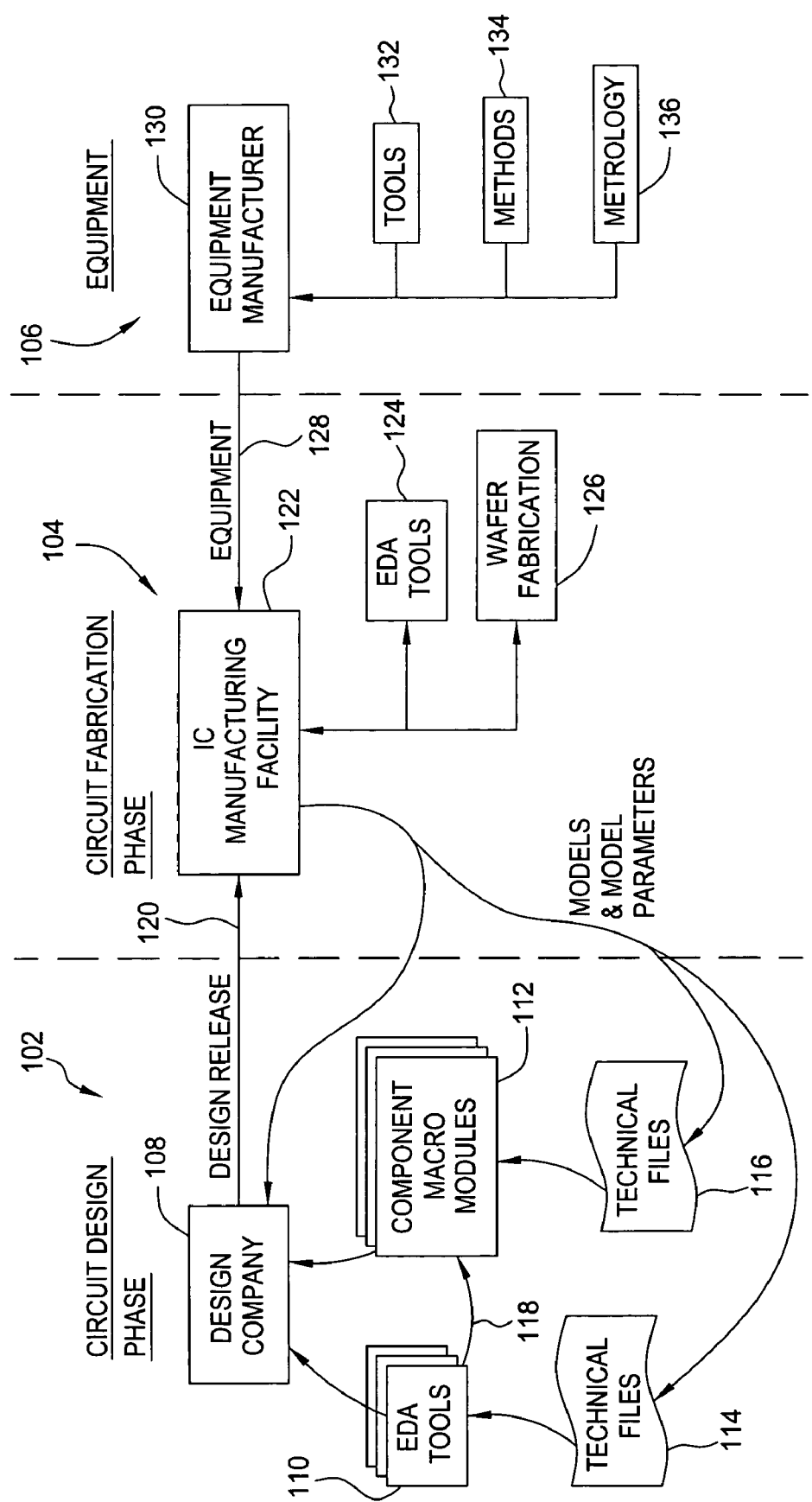
FIG. 1 depicts a block diagram of the components of an integrated circuit fabrication process in accordance with the prior art.
Figure 2:
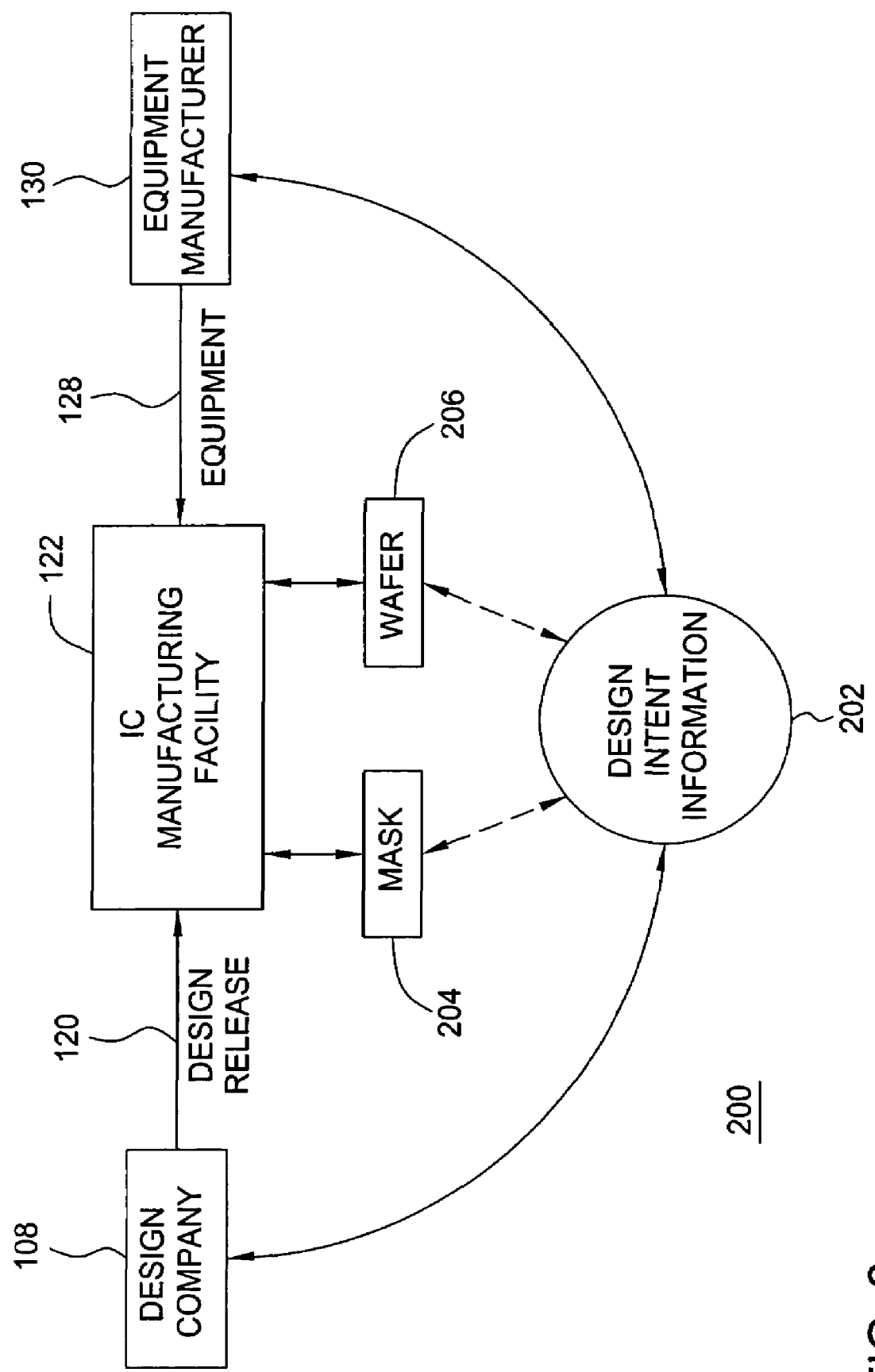
FIG. 2 depicts a block diagram of a integrated circuit fabrication process in accordance with the present invention.

FIG. 2 depicts a block diagram of an integrated circuit fabrication process 200 in accordance with the present invention. The process 200 involves a design company 108, an IC manufacturing facility 122 and an equipment manufacturer 130 as discussed with respect to FIG. 1. In accordance with the present invention, while developing a design release, the design company captures the design intent used during the design process. The design company produces a design release along path 120 as well as design intent information 202. The design intent information 202 may be coupled to the equipment manufacturer 130 or to the IC manufacturing facility 122 after the equipment is installed. The design intent information 202 may be processed (e.g., filtered or optimized) prior to use within the IC manufacturing facility. The design intent information will be utilized by the equipment supplied by the equipment manufacturer 130 to optimize IC fabrication processes (mask and wafer manufacturing 204 and 206) to achieve certain design criteria that is identified as being critical within the design intent information 202. In an alternative embodiment described below with respect to FIG. 5, design intent information in the form of manufacturability information may also flow from the equipment manufacturer 130 and/or the IC manufacturing facility 122 to the design company 108.

Figure 3:
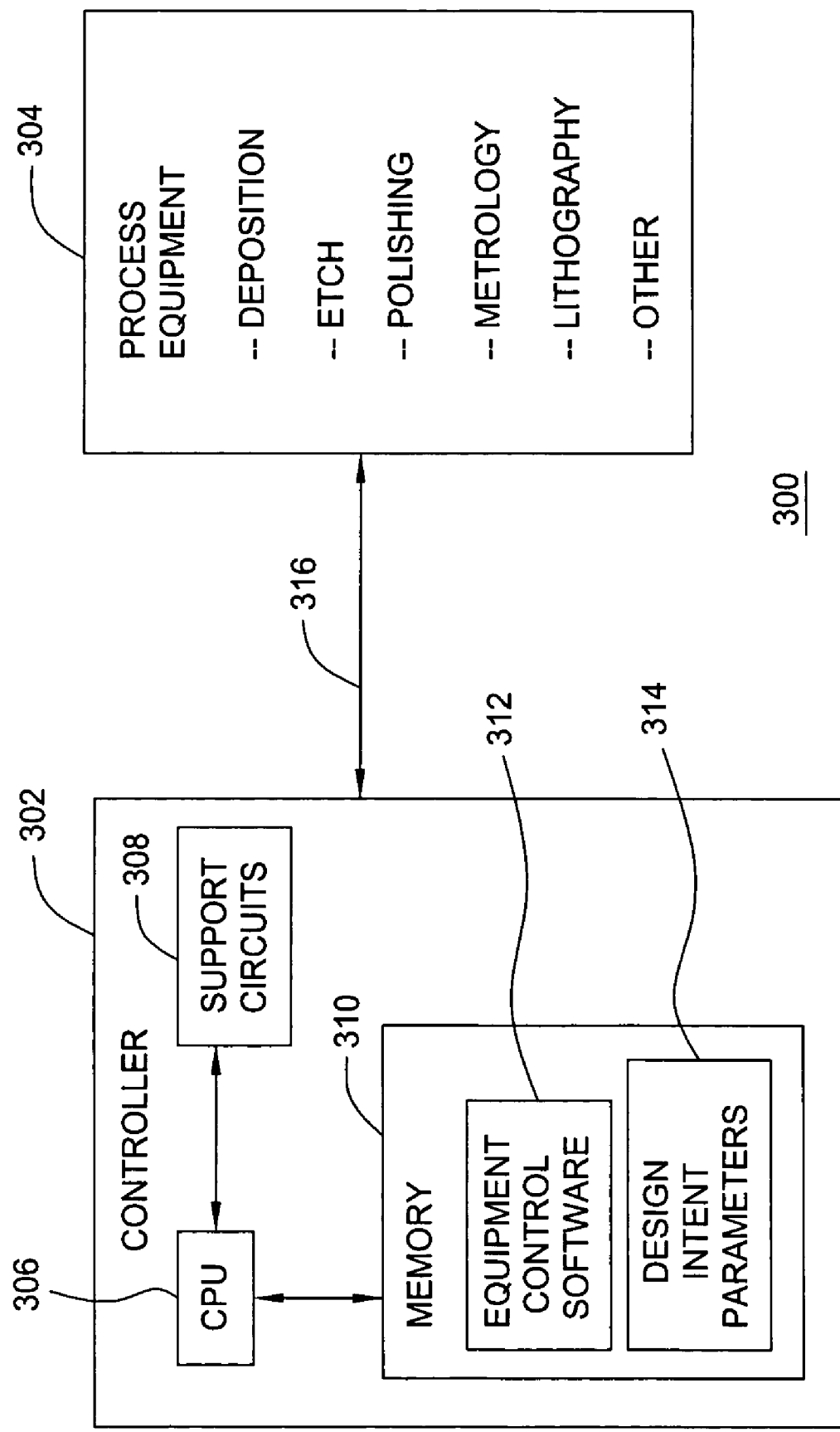
FIG. 3 depicts a block diagram of a generic arrangement of semiconductor integrated circuit fabrication equipment.

FIG. 3 depicts a generic arrangement 300 of IC fabrication equipment supplied by the equipment manufacturer 130 that utilizes the design intent information in accordance with the present invention. The equipment arrangement 300 includes a controller 302 and process equipment 304. The controller 302 comprises a central processing unit (CPU) 306, support circuits 308 and memory 310. The CPU 306 is generally one or more processors, microprocessors, or micro-controllers that operate in accordance with instructions that are stored in memory 310. The support circuits 308 are well known support circuits comprising cache, power supplies, clock circuits, input/output interface circuits and the like. Memory 310 comprises random access memory, read only memory, removable memory, disk drives, or combinations thereof. The memory 310 stores various types of software including equipment control software 312 and design intent parameters 314. The controller 302, when executing equipment control software 312, sends control messages along path 316 to various process equipment 304 within the IC manufacturing facility 122 of FIG. 1. Process equipment 304 may comprise deposition equipment, etch equipment, polishing equipment, metrology equipment, lithography equipment and the like.

Within the IC manufacturing facility, there may be one or more controllers that control various combinations of process equipment. When controlling the process equipment 304, the design intent parameters 314 are used within the equipment control software 312 to insure that the process equipment is operated in such a manner that the design intent information supplied by the designer is fulfilled. In essence, the design intent information is supplied to the controller to facilitate creation of the design intent parameters 314 that inform the processing tools of what they are actually making such that they may optimize the product. This information may be supplied to the equipment manufacturer such that the tool is designed to facilitate using the design intent information. The design intent information may be processed (e.g., filtered or optimized) to produce the parameters 314.

Additionally or alternatively, the design intent information for a specific design is supplied to the IC manufacturing facility along with the design release to enable the facility to optimize the integrated circuit fabrication process.

Figure 4:
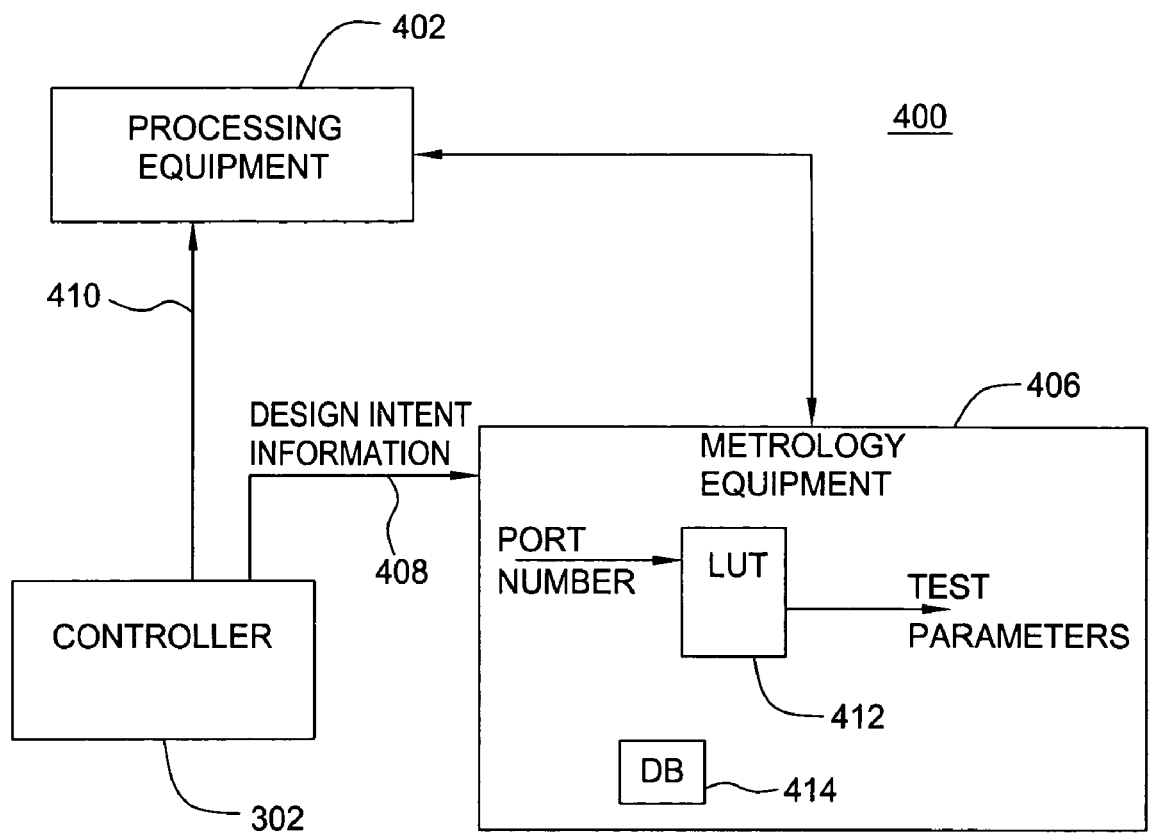
FIG. 4 depicts a block diagram of an arrangement of equipment, where the metrology equipment utilizes design intent information in its operation.

FIG. 4 depicts a block diagram of one embodiment of the invention using design intent information within the metrology equipment. The equipment arrangement 400 comprises a controller 302, processing equipment 402 and metrology equipment 406. The processing equipment 402 comprises one or more integrated circuit fabrication process tools including etch reactors, deposition reactors, chemical mechanical polishing (CMP) equipment, lithography equipment and the like. The controller 302 utilizing equipment control software controls the process equipment in a conventional manner along path 410. Additionally, controller 302 supplies design intent information along path 408 to the metrology equipment 406. This information enables the metrology equipment 406 to optimize its testing of the wafers as they are produced by the processing equipment 402 in view of the design intent information.

For example, if an SRAM module is to be fabricated upon a particular integrated circuit that is being fabricated by the processing equipment 402, the SRAM module has a critical dimensions requirement to enable the NMOS and PMOS transistors to be balanced. The design intent information identifies that a particular part number (e.g., the SRAM part number) is being created by the processing equipment 402. This part number may be applied to a database, such as a lookup table 412 that identifies specific test parameters that can be used to test the particular SRAM module being manufactured. Because the SRAM is identified as a critical component of the IC, the metrology equipment will focus testing on this component. For example, line width testing can be performed near the location of the SRAM. Although the LUT 412 is shown as being located in the metrology equipment, those skilled in the art will realize that the LUT 412 can be located in the controller 302 or elsewhere (e.g., via a LAN or WAN).

Metrology equipment that is flexible enough to produce such on-demand testing is the TRANSFORMA metrology equipment manufactured by Applied Materials Inc. of Santa Clara, Calif. By identifying the part number for the module being used on the integrated circuit, the metrology equipment can utilize test parameters that are optimized for insuring that, for example, the NMOS and PMOS transistors are balanced. As such, particular metrology testing will be performed with respect to the critical dimensions of the NMOS and PMOS transistors of the SRAM module. The testing may be used to optimize either processing of the wafer during fabrication or it may be used to optimize the mask creation process wherein, for example, mask trimming can be optimized in view of the measurements taken by the metrology equipment.

In another embodiment of the invention, the designer identifies the longest speed path within the logic on an integrated circuit as the design intent information. This longest speed path is identified as a critical characteristic of the integrated circuit. The design intent information is passed to the metrology equipment 406 to insure that testing is performed to achieve optimization of the longest speed path. As such, the metrology equipment 406 will be directed to monitor the critical dimensions of the circuit components and lines along the longest path. The measurements made by the metrology equipment 406 can be matched to a database 414 of information to insure that the parameters and critical dimensions of the longest path are being met by the processing equipment. Such metrology can be performed by comparing images of an ideal line or transistor that is stored within a database to the measured or captured line or transistor that has been produced by the processing equipment 402. The result of the comparison can be used to control the processing equipment 402 to achieve the ideal line and/or transistor structure that provides the best long pathway performance.

Figure 5:
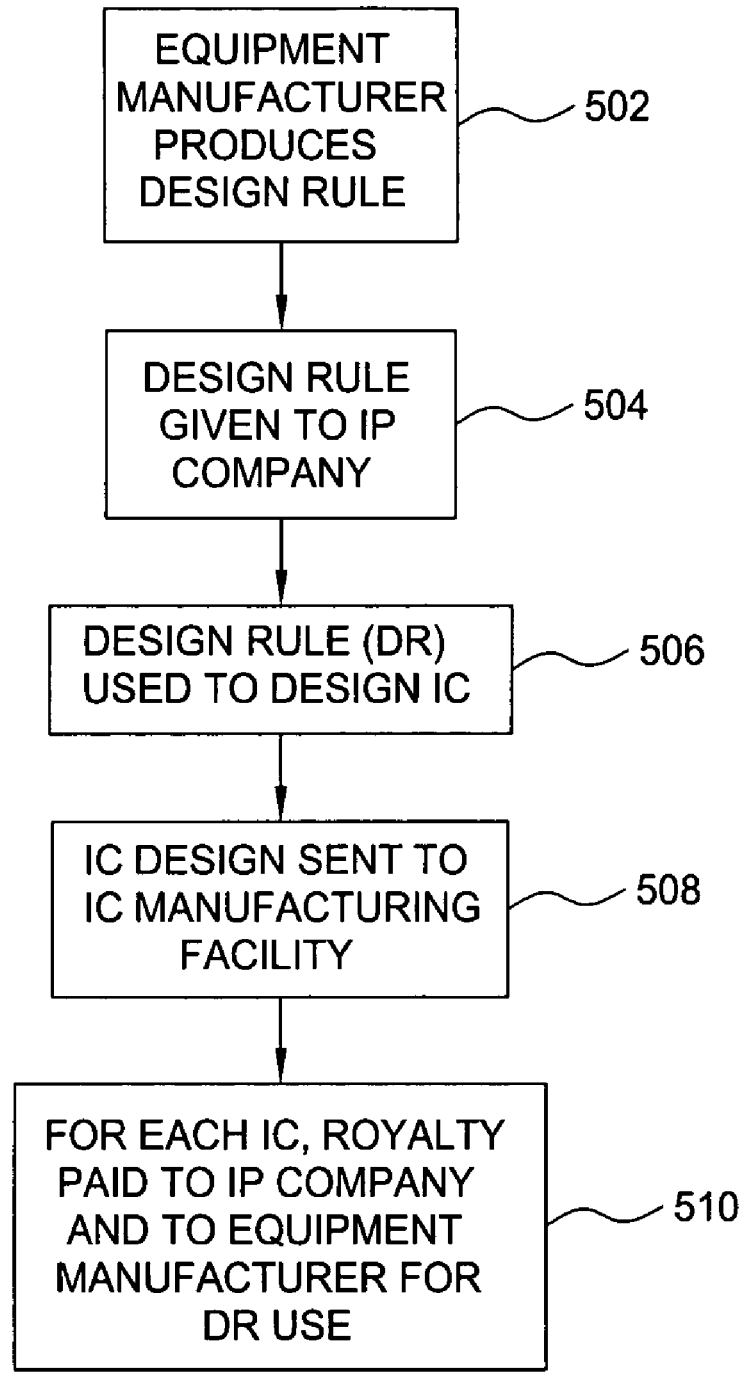
FIG. 5 depicts a flow diagram of a process for using design rules within the integrated circuit manufacturing process.

FIG. 5 depicts a flow diagram of a process 500 for utilizing design rules that capture the design intent information of a designer. In certain instances the semiconductor wafer processing equipment performs optimally when an integrated circuit layout is created in a particular manner or fashion. For example, to control dishing when using chemical mechanical polishing (CMP) equipment, a dummy structure, e.g., a plurality of conductive patches, is positioned proximate to a conductive line within the integrated circuit. In other instances, these design rules or models may be circuit structures, particular process recipes, component models, and the like. At step 502, the equipment manufacturer produces a design rule (DR), e.g., the design rule for CMP polishing may include the need for dummy structures along lines of certain length. The design rule may also comprise manufacturability information that will inform the designer when their design parameters may exceed the manufacturing equipment's performance. In that instance, the designer can be informed about any tradeoff between yield and performance that would result from using the proposed design parameters.

Figure 6:
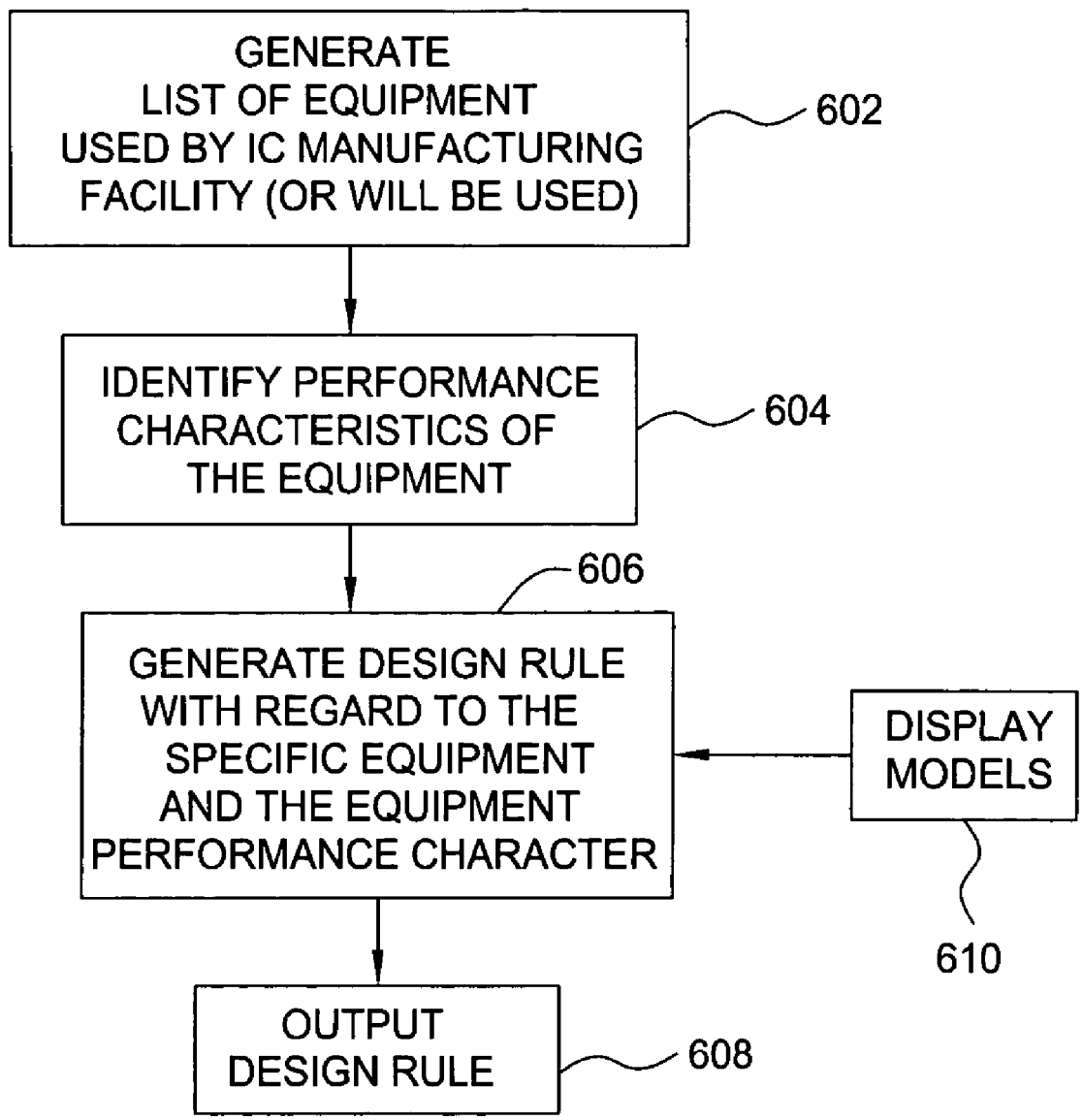
FIG. 6 depicts a flow diagram of an exemplary method for generating a design rule.

FIG. 6 depicts an exemplary method 600 for producing a design rule for use by method 500. The method 600 may be practiced by at least one of the IC manufacturing facility, equipment manufacturers, the device designer, or a third party that is unrelated to the foregoing parties. The method 600 begins at step 602 wherein a list of equipment that is used or will be used is produced by the IC manufacturing facility. At step 604, the performance characteristics of the listed equipment are identified. At step 606, a design rule for the device to be fabricated is generated that takes into account the specific listed equipment and the performance characterizations (e.g., performance limitations) of that equipment. Design rule generation is facilitated by device models 610 that are used by step 606. These device models are developed using physics derivation and empirical analysis. Depending on the design rule being generated, the models may include SPICE models, photoresist mask models, interconnect structure models and the like. Such models correlate a measurable, physical feature to a design or performance requirement. At step 608, the method 600 outputs the design rule.

Returning to the method 500 of FIG. 5, the design rule is given to the component macro designer at step 504, which incorporates the design rule into the macros. For example, a macro that contains a particular length of line will, when used by a designer, automatically add to the layout the appropriate dummy structure to achieve optimal line fabrication when using the equipment. In other applications, a designer may use a particular model or embed a specific process recipe that optimizes the circuit design for a particular set of equipment.

For example, the manufacturability information within a design rule may provide process models for the IC manufacturing equipment that will be used to manufacture the IC. These process models allow a comparison of yield vs. performance such that a designer can select a level of tradeoff between yield and performance. Additionally, in view of manufacturability information, the designer can change design attributes such as floor plan, RTL code, layout, routing, line widths, via count and placement, layer thickness, and so on. The manufacturability information allows for the development and use of a statistical model-based set of design and verification models or rules that function in 3 dimensions, e.g., position on the substrate, width of the feature and thickness of the feature. Process models that include such manufacturability information may be formed for equipment that performs CMP, lithography, etch, plating, chemical and physical vapor, deposition, oxidation, and the like.

At step 506, the design rule is used to design the integrated circuit such that when a designer selects a particular structure from the macro library that structure will automatically comply with the design rule.

At step 508, the IC design is sent to the IC manufacturing facility. At step 510, for each IC that is created using the macro that contains the design rule, a royalty is paid to both the IP company for the macro and to the equipment manufacturer for use of the design rule. Alternatively, the equipment manufacturer could be paid an access fee or other form of royalty for the design rule.

The manufacturability information can be produced for the models by performing EDA testing at the equipment manufacturer's facility. Generally, the EDA testing is completed at the equipment manufacturer's facility and the model can be created using the EDA data by an EDA company or the equipment manufacturer. As such, the models can be produced and distributed to the designers prior to an IC manufacturing facility having the equipment. The designer can then design ICs using the equipment manufacturer's models and request that the IC manufacturing facility use the equipment specified in the design. Because the models are closely tied to specific equipment sub-modules (e.g., a specific etch reactor, a specific deposition reactor, and the like), the statistical distribution of physical attributes is tighter than if the designer designed an IC without the manufacturability information-based models, i.e., design to an unknown suite of equipment used by an IC manufacturing facility. By designing with specific sub-modules in mind, the granularity of the design parameters is reduced thus enabling designs that result in the production of ICs with very high performance, repeatability and yield.

While foregoing is directed to various embodiments of the present invention, other and further embodiments of the invention may be devised without departing from the basic scope thereof, and the scope thereof is determined by the claims that follow.

The invention claimed is:

1. A method of fabricating integrated circuits comprising:
   capturing design intent information of an integrated circuit designer;
   developing a design release in accordance with the design intent information;
   forwarding the design intent information and the design release to an integrated circuit manufacturing facility; and
   using the design intent information within integrated circuit manufacturing equipment of the integrated circuit manufacturing facility to optimize an integrated circuit produced in accordance with the design release and the design intent.

2. The method of claim 1 wherein the design intent information comprises at least one location of a critical circuit element.

3. The method of claim 2 wherein the at least one location is measured by metrology equipment within the integrated circuit manufacturing equipment.

4. The method of claim 2 wherein the critical circuit element is measured by metrology equipment within the integrated circuit manufacturing equipment.

5. The method of claim 2 wherein the design intent information comprises a location and critical dimensions of particular conductive lines within the integrated circuit.

6. The method of claim 5 wherein the location and critical dimensions are used by metrology equipment within the integrated circuit manufacturing equipment.

7. The method of claim 1 wherein the design intent information comprises an identification of a critical circuit element within the integrated circuit.

8. The method of claim 1 wherein the design intent information comprises at least one circuit attribute selected from the group consisting of specification of yield, speed and power consumption.

9. The method of claim 1 wherein the design intent information comprises equipment utilization information that is provided by an integrated circuit manufacturing equipment manufacturer to the integrated circuit designer.

10. The method of claim 9 wherein the equipment utilization information is a design rule that defines an optimal circuit configuration to be formed by the integrated circuit manufacturing equipment.

11. The method of claim 10 wherein the design rule identifies a location to position dummy structures to prevent dishing when using a chemical-mechanical polishing tool to manufacture the integrated circuit.

12. The method of claim 9 wherein the equipment utilization information comprises manufacturability information.

13. Apparatus for fabricating an integrated circuit comprising:
    integrated circuit manufacturing equipment comprising at least one metrology equipment for inspecting a structure of the integrated circuit fabricated under a design release,
    the metrology equipment having design intent information associated with the design release, wherein a comparison between the design intent information and at least one of an attribute obtained from a portion of an integrated circuit being manufactured is used to control the integrated circuit manufacturing equipment, wherein the attribute is developed by the design release designed in accordance with the design intent information.

14. The apparatus of claim 13 wherein the design intent information comprises a database of critical elements located on the integrated circuit.

15. The apparatus of claim 14 wherein the design intent information comprises a look-up-table of critical elements located on the integrated circuit.

16. A method for improving integrated circuit (IC) manufacturing comprising:
    capturing manufacturability information for integrated circuit manufacturing equipment;
    incorporating the manufacturability information into a design rule for designing an integrated circuit IC;
    capturing design intent information of an integrated circuit designer with respect to a design release;
    including the manufacturability information as a portion of the design intent information;
    forwarding the design intent information and the design release to an integrated circuit manufacturing facility; and
    using the design intent information with the integrated circuit manufacturing equipment of the integrated circuit manufacturing facility to optimize the integrated circuit in accordance with the design release and the design intent.

17. The method of claim 16 wherein the design intent information comprises at least one location of a critical circuit element.

18. The method of claim 17 wherein the at least one location is measured by metrology equipment within the integrated circuit manufacturing equipment.

19. The method of claim 17 wherein the critical circuit element is measured by metrology equipment within the integrated circuit manufacturing equipment.

20. The method of claim 17 wherein the design intent information comprises a location and critical dimensions of particular conductive lines within the integrated circuit.

21. The method of claim 20 wherein the location and critical dimensions are used by metrology equipment within the integrated circuit manufacturing equipment.

22. The method of claim 16 wherein the design intent information comprises an identification of a critical circuit element within the integrated circuit.

23. The method of claim 16 wherein the design intent information comprises at least one circuit attribute selected from the group consisting of specification of yield, speed and power consumption.

24. The method of claim 16 wherein the design intent information comprises equipment utilization information that is provided by an integrated circuit manufacturing equipment manufacturer to the integrated circuit designer.

25. The method of claim 24 wherein the equipment utilization information is a design rule that defines an optimal circuit configuration to be formed by the integrated circuit manufacturing equipment.

26. The method of claim 25 wherein the design rule identifies a location to position dummy structures to prevent dishing when using a chemical-mechanical polishing tool to manufacture the integrated circuit.

27. The method of claim 24 wherein the equipment utilization information comprises manufacturability information.

28. The method of claim 16 further comprising:
generating a list of equipment that is used and/or will be used by the integrated circuit manufacturing facility;
identifying the performance characteristics of the listed equipment;
generating the design rule using the performance characteristics of the listed equipment and device models of integrated circuit structures to be defined by the design rule.

29. An integrated circuit manufacturing facility comprising integrated circuit manufacturing equipment adapted to operate in accordance with an integrated circuit design release and design intent information.

30. The integrated circuit manufacturing facility of claim 29 wherein the design intent information comprises at least one location of a critical circuit element.

31. The integrated circuit manufacturing facility of claim 30 further comprising metrology equipment, wherein the at least one location is measured by the metrology equipment.

32. The integrated circuit manufacturing facility of claim 30 further comprising metrology equipment, wherein the critical circuit element is measured by the metrology equipment.

33. The integrated circuit manufacturing facility of claim 32 wherein the equipment utilization information is a design rule that defines an optimal circuit configuration to be formed by the integrated circuit manufacturing equipment.

34. The integrated circuit manufacturing facility of claim 33 wherein the design rule identifies a location to position dummy structures to prevent dishing when using a chemical-mechanical polishing tool to manufacture the integrated circuit.

35. The integrated circuit manufacturing facility of claim 30 wherein the design intent information comprises a location and critical dimensions of particular conductive lines within the integrated circuit.

36. The integrated circuit manufacturing facility of claim 35 further comprising metrology equipment, wherein the location and critical dimensions are used by the metrology equipment.

37. The integrated circuit manufacturing facility of claim 30 further comprising a source of design intent information.

38. The integrated circuit manufacturing facility of claim 37 wherein the source comprises a database of critical elements located on the integrated circuit.

39. The integrated circuit manufacturing facility of claim 37 wherein the comprises a look-up-table of critical elements located on the integrated circuit.

40. The integrated circuit manufacturing facility of claim 29 wherein the design intent information comprises an identification of a critical circuit element within the integrated circuit.

41. The integrated circuit manufacturing facility of claim 29 wherein the design intent information comprises at least one circuit attribute selected from the group consisting of specification of yield, speed and power consumption.

42. The integrated circuit manufacturing facility of claim 29 wherein the design intent information comprises equipment utilization information that is provided by an integrated circuit manufacturing equipment manufacturer to the integrated circuit designer.

43. The method of claim 42 wherein the equipment utilization information comprises manufacturability information.

* * * * *

UNITED STATES PATENT AND TRADEMARK OFFICE
CERTIFICATE OF CORRECTION

| | |
|---|---|
| PATENT NO. | : 7,313,456 B2 |
| APPLICATION NO. | : 10/818929 |
| DATED | : December 25, 2007 |
| INVENTOR(S) | : Madok et al. |

It is certified that error appears in the above-identified patent and that said Letters Patent is hereby corrected as shown below:

In claim 39, col. 10 line 34, after "wherein the" insert -- SOURCE --.

In claim 43, col. 10 line 49, delete "method" and insert -- INTEGRATED CIRCUIT MANUFACTURING FACILITY -- therefor.

Signed and Sealed this

Twenty-third Day of December, 2008

JON W. DUDAS
*Director of the United States Patent and Trademark Office*